United States Patent
Chiou (10) Patent No.: US 8,581,615 B2
(45) Date of Patent: Nov. 12, 2013

(54) METHOD FOR CHECKING ALIGNMENT ACCURACY OF THIN FILM TRANSISTOR INCLUDING PERFORMING A CLOSE/OPEN CIRCUIT TEST

(75) Inventor: Chi-Ming Chiou, Taoyuan County (TW)

(73) Assignee: Chunghwa Picture Tubes, Ltd., Bade, Taoyuan (TW)

(*) Notice: Subject to any disclaimer, the term of this patent is extended or adjusted under 35 U.S.C. 154(b) by 411 days.

(21) Appl. No.: 12/958,346

(22) Filed: Dec. 1, 2010

(65) Prior Publication Data

US 2012/0007628 A1 Jan. 12, 2012

(30) Foreign Application Priority Data

Jul. 9, 2010 (TW) .............................. 99122706 A (51) Int. Cl.
*G01R 31/26* (2006.01)
(52) U.S. Cl.
USPC .................... 324/760.02; 324/770; 438/18
(58) Field of Classification Search
USPC .................. 324/760.02, 770; 438/18
See application file for complete search history.

(56) References Cited

U.S. PATENT DOCUMENTS

| | | | | |
|---|---|---|---|---|
| 5,173,792 | A * | 12/1992 | Matsueda | 349/54 |
| 5,175,504 | A * | 12/1992 | Henley | 324/501 |
| 5,600,460 | A * | 2/1997 | Yamamoto et al. | 349/54 |
| 6,781,403 | B2 * | 8/2004 | Kim | 324/750.3 |
| 8,030,650 | B2 * | 10/2011 | Lin et al. | 257/48 |
| 8,053,293 | B2 * | 11/2011 | Kim et al. | 438/158 |
| 2006/0061381 | A1 * | 3/2006 | Lee et al. | 324/770 |
| 2006/0139526 | A1 * | 6/2006 | Ahn et al. | 349/114 |
| 2007/0126460 | A1 * | 6/2007 | Chung et al. | 324/770 |
| 2009/0302318 | A1 | 12/2009 | Chang | |
| 2010/0117081 | A1 * | 5/2010 | Obuchi et al. | 257/48 |
| 2013/0038806 | A1 * | 2/2013 | Tae et al. | 349/43 |

FOREIGN PATENT DOCUMENTS

| | | |
|---|---|---|
| TW | 200743214 | 11/2007 |
| TW | 200848741 | 12/2008 |
| TW | 200848898 | 12/2008 |
| TW | 201007261 | 2/2010 |

* cited by examiner

*Primary Examiner* — Anh Mai
(74) *Attorney, Agent, or Firm* — Winston Hsu; Scott Margo (57) ABSTRACT

A method for checking alignment accuracy of a thin film transistor includes providing a substrate, forming a first conductive layer on the substrate, performing a first patterning process to form a gate electrode of a thin film transistor and a first terminal and a second terminal of a testing device, forming a first insulating layer covering the first terminal, the second terminal and the gate electrode on the substrate, forming a contact hole substantially corresponding to the first terminal and the second terminal in the first insulating layer, forming a pixel electrode and a connecting electrode of the testing device in the first contact hole, and performing a close/open circuit test. When the first terminal, the connecting electrode and the second terminal construct a close circuit, alignment accuracy is confirmed. When the first terminal, the connecting electrode and the second terminal construct an open circuit, alignment inaccuracy is confirmed.

8 Claims, 13 Drawing Sheets

METHOD FOR CHECKING ALIGNMENT ACCURACY OF THIN FILM TRANSISTOR INCLUDING PERFORMING A CLOSE/OPEN CIRCUIT TEST

BACKGROUND OF THE INVENTION

1. Field of the Invention

The present invention is related to a method for checking alignment accuracy of a thin film transistor (TFT), and more particularly, to a method for checking alignment accuracy of a TFT integrated with electrical tests.

2. Description of the Prior Art

TFTs are widely used in a number of applications. A particularly important application for TFT technology is in the field of active matrix liquid crystal displays. The current state of the art process for making a TFT liquid crystal displays (TFT-LCDs) is to form a plurality of TFTs on a substrate. Therefore, the alignment accuracy between each layer of the TFT is critical in the TFT manufacturing.

The conventional method of manufacturing a TFT and a pixel electrode can be summarized as followed: a substrate is first provided and followed by forming a metal layer on the substrate. Then, a first patterning process is performed to pattern the metal layer and to form a gate electrode. Thereafter, an insulating layer is formed on the gate electrode and followed by sequentially forming an undoped semiconductor layer and a doped semiconductor layer on the insulating layer. Subsequently, a second patterning process is performed to pattern the undoped semiconductor layer and the doped semiconductor layer, thus a semiconductor structure is formed. Next, another metal layer is formed on the substrate and followed by performing a third patterning process. Consequently, the metal layer is patterned to form a source/drain. After forming the source/drain, another insulating layer is formed on the substrate and followed by performing a fourth patterning process. Accordingly, a contact hole is formed in the insulating layer by the fourth patterning process. Thereafter, a transparent conductive layer is formed on the substrate and followed by performing a fifth patterning process. Accordingly, the transparent conductive layer is patterned to form a pixel electrode electrically connected to the source/drain through the contact hole. Consequently, a TFT and a pixel electrode are obtained.

According to the conventional method of manufacturing TFT as mentioned above, it is well-known to those skilled in the art that the gate electrode, the semiconductor structure, the source/drain, the contact hole, and the pixel electrode are obtained by the patterning processes: Firstly, a desired layout pattern is transferred from a photomask to a photoresist by lithography techniques, and then the desired layout pattern is transferred from the photoresist to the objective layer by etching techniques. Therefore, each layout pattern of the photomask must be precisely and accurately aligned, otherwise the layout pattern may not be connected to a layout pattern in the former layer. In such cases, the desired circuit is adversely impacted, even is failed. Therefore, methods such as optical metrologies serving as alignment inspections are developed to check the alignment accuracy of the photomask as a countermeasure against to the aforementioned problems.

However, the sampling rates for typical optical metrologies are in a range of 1-5%, and the measurement time lasts 10-20 minutes. Accordingly, conventional optical metrologies suffer low sampling rates and such sampling rates cannot be improved due to the long measurement time. In addition, the prior art even increases the amount of the measurement systems for increasing the sampling rates. However, it still suffers high process cost.

SUMMARY OF THE INVENTION

Therefore, the present invention provides a method for checking alignment accuracy of a TFT for replacing the conventional optical metrologies.

According to an aspect of the present invention, a method for checking alignment accuracy of a TFT is provided. The method includes providing a substrate having a pixel region and a test region defined thereon; forming a first conductive layer on the substrate and performing a first patterning process to the first conductive layer to form a gate electrode of a TFT in the pixel region and a first terminal and a second terminal of a testing device in the test region, wherein the first terminal and the second terminal are electrically isolated from each other; forming a first insulating layer covering the gate electrode of the TFT and the first terminal and the second terminal of the testing device on the substrate; forming a first contact hole corresponding to the first terminal and the second terminal of the testing device in the first insulating layer; forming a pixel electrode in the pixel region and a connecting electrode of the testing device in the first contact hole in the test region; and performing a close/open circuit test to the first terminal, the connecting electrode and the second terminal of the testing device. When the first terminal, the connecting electrode and the second terminal of the testing device construct a close circuit, alignment accuracy is confirmed. When the first terminal, the connecting electrode and the second terminal of the testing device construct an open circuit, alignment inaccuracy is confirmed.

According to the method for checking alignment accuracy of a TFT provided by the present invention, the first contact hole is formed simultaneously with forming the semiconductor structure, the source/drain, the pixel electrode, or the second contact hole for electrically connecting the pixel electrode and the source/drain of the TFT. When the first contact hole is not accurately aligned and formed, the connecting electrode, the first terminal and the second terminal of the testing device are not electrically connected to each other, and thus open circuit is obtained. Accordingly, alignment inaccuracy of the patterning process for forming the first contact hole and the corresponding layer is confirmed. Furthermore, the method for checking alignment accuracy of a TFT provided by the present invention is operated as a close/open circuit test, therefore the test results are easily and speedily obtained. Accordingly, measurement time for checking alignment accuracy of a TFT is substantially reduced and sampling rate is increased.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-4B are drawings illustrating a method for checking alignment accuracy of a TFT provided by a first preferred embodiment of the present invention, wherein

FIGS. 5-8 are drawings illustrating a method for checking alignment accuracy of a TFT provided by a second preferred embodiment of the present invention, wherein

FIGS. 9-11 are drawings illustrating a method for checking alignment accuracy of a TFT provided by a third preferred embodiment of the present invention, wherein

DETAILED DESCRIPTION

Figure 1:
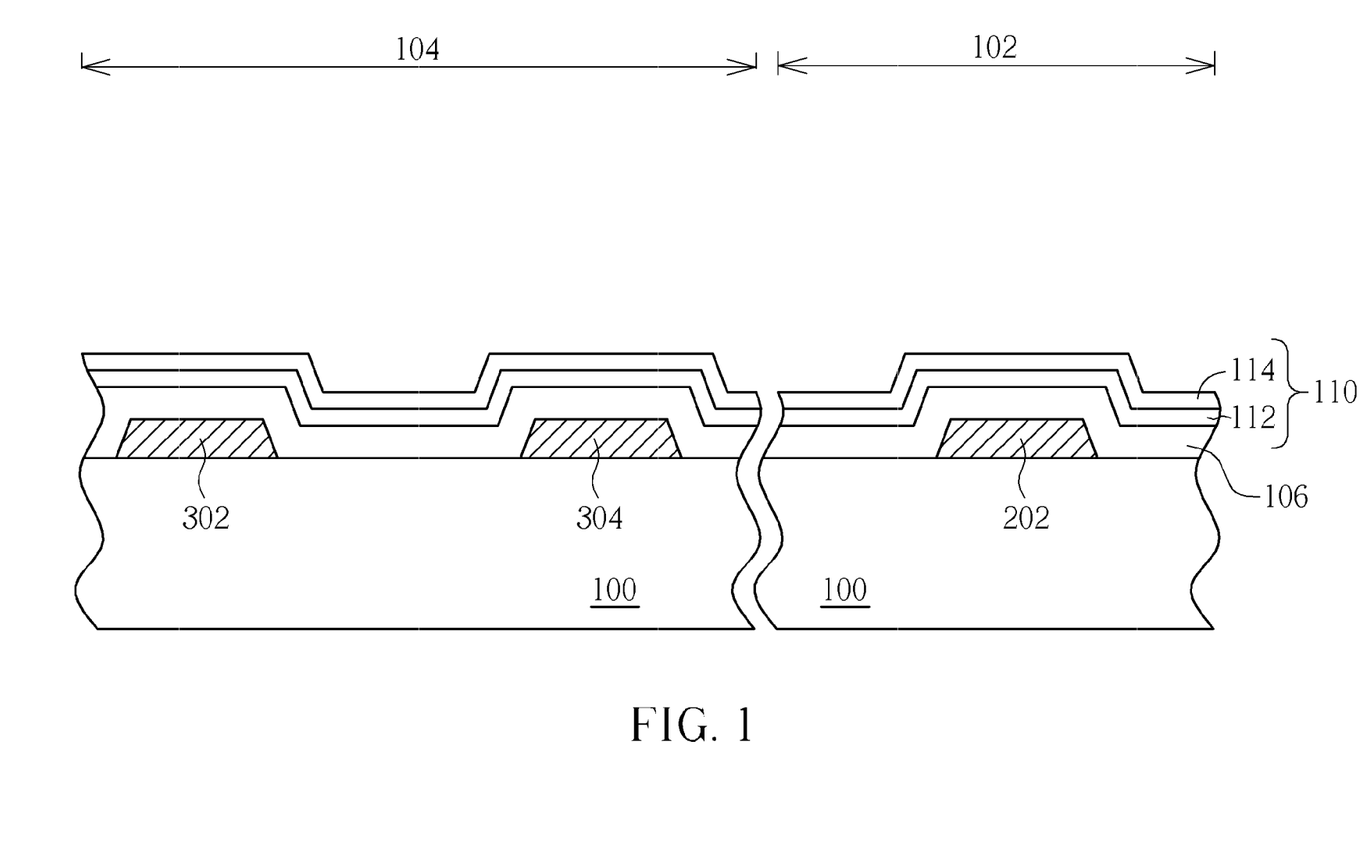
Figure 2:
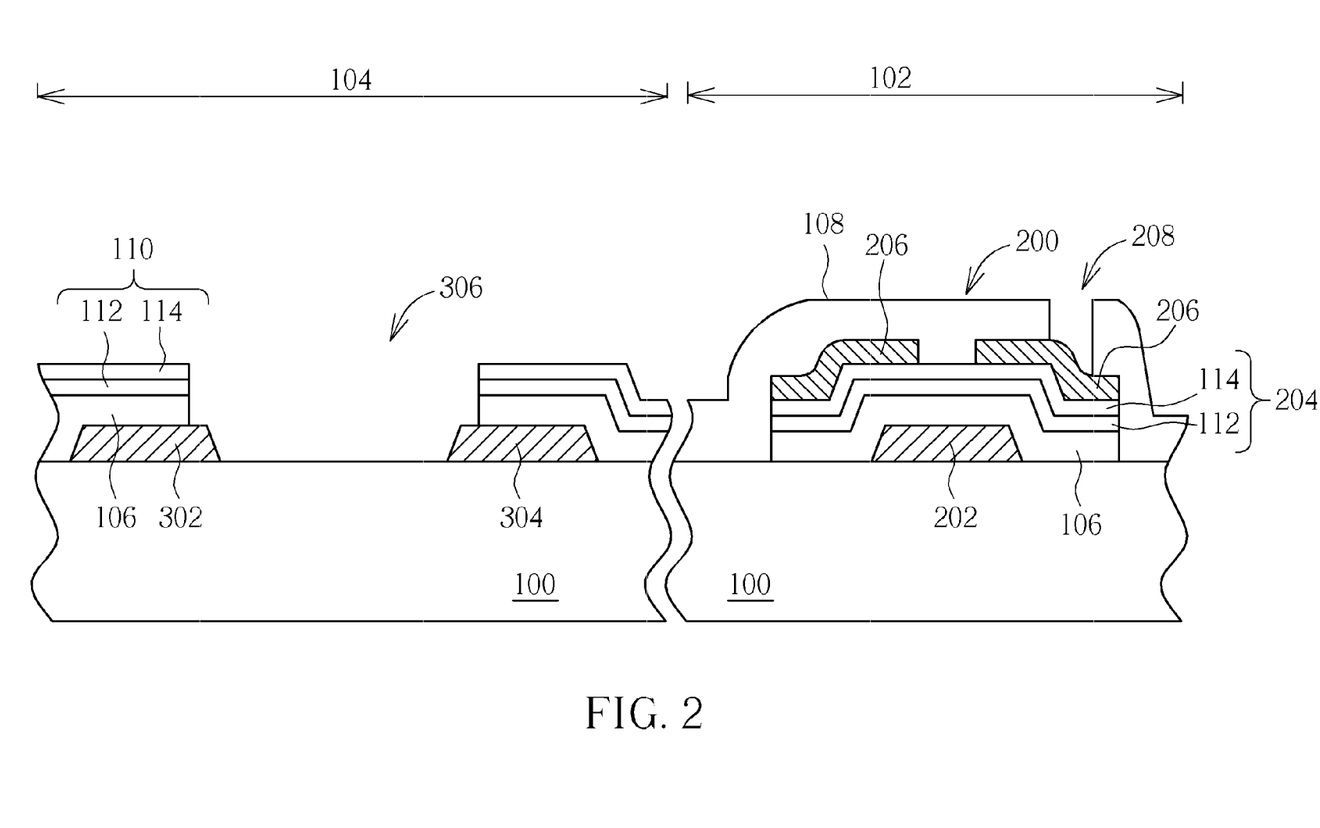
Figure 3:
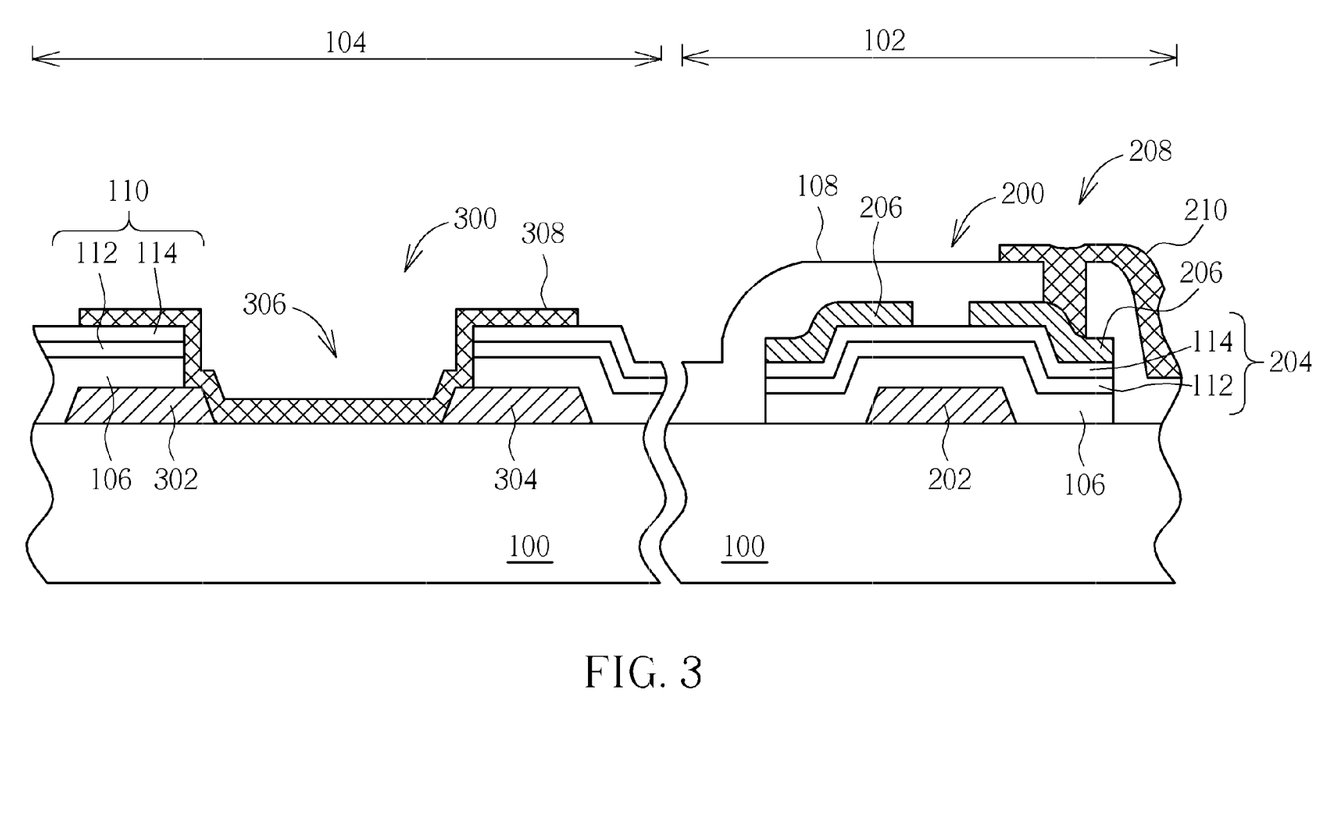
Figure 4A:
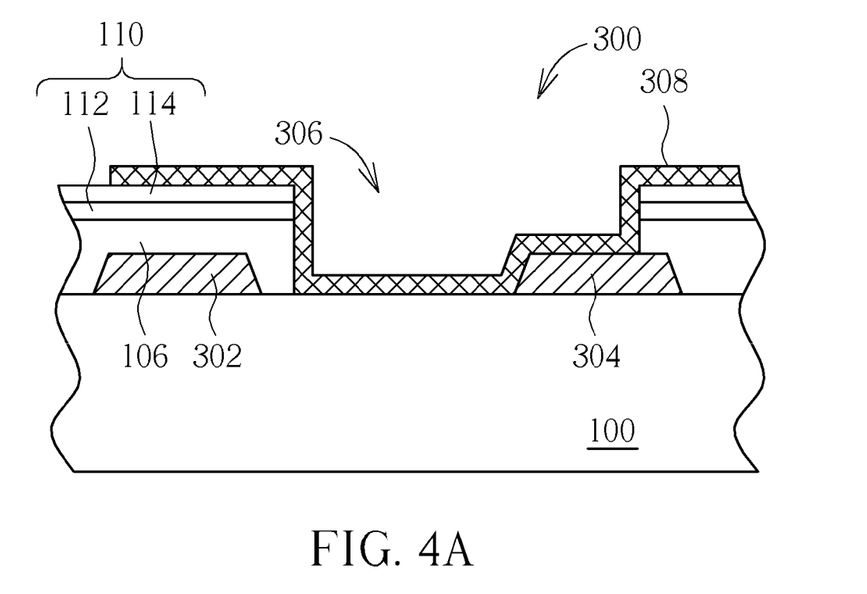
FIGS. 4A-4B are schematic drawings illustrating a portion of the testing device provided by the preferred embodiment.
Figure 4B:
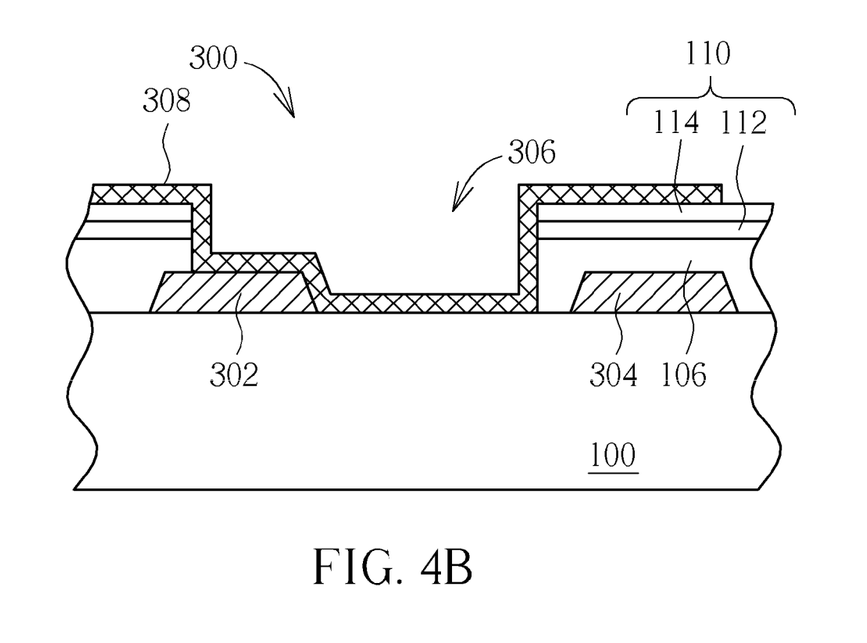

Please refer to FIGS. 1-4B, which are drawings illustrating a method for checking alignment accuracy of a TFT provided by a first preferred embodiment of the present invention, wherein FIGS. 4A-4B are schematic drawings illustrating a portion of the testing device provided by the preferred embodiment. As shown in FIG. 1, a substrate 100 having a pixel region 102 and a test region 104 defined thereon is provided. Then, a first conductive layer (not shown) is formed on the substrate 100 and followed by performing a first patterning process to the first conductive layer. Accordingly, a gate electrode 202 of a TFT is formed in the pixel region 102, and simultaneously a first terminal 302 and a second terminal 304 of a testing device are formed in the test region 104. It is noteworthy that the first terminal 302 and the second terminal 304 are electrically isolated from each other. Additionally, the first patterning process is well-known to those skilled in the art, therefore the details such as the lithography methods and etching methods are all omitted herein in the interest of brevity.

Next, a first insulating layer 106 is formed on the substrate 100. The first insulating layer 106 covers the gate electrode 202 of the TFT and the first terminal 302 and the second terminal 304 of the testing device as shown in FIG. 1. Subsequently, an undoped semiconductor layer 112 such as an undoped amorphous silicon layer or an undoped polysilicon layer and a doped semiconductor layer 114 such as a doped amorphous silicon layer or a doped polysilicon layer are upwardly and sequentially formed on the substrate 100. The undoped semiconductor layer 112 and the doped semiconductor layer 114 construct a semiconductor layer 110.

Please refer to FIG. 2. A second patterning process is performed to pattern the semiconductor layer 110 and to form at least a semiconductor structure 204 on the first insulating layer 106. The semiconductor structure 204 is corresponding to the gate electrode 202 in the pixel region 102. The undoped semiconductor layer 112 of the semiconductor structure 204 serves as a channel layer of the TFT and the doped semiconductor layer 114 serves as an Ohmic contact layer for reducing the contact resistance between the undoped semiconductor layer 112 and the metal layers following formed. It is noteworthy that in the preferred embodiment, the semiconductor layer 110 and the first insulating layer 106 under the semiconductor layer 110 in the test region 104 are simultaneously patterned in the second patterning process. Consequently, a first contact hole 306 is formed in the first insulating layer 106 and the semiconductor layer 110 in the test region 104. The first contact hole 306 is corresponding to the first terminal 302 and the second terminal 304 of the testing device. In other words, the first contact hole 306 is formed substantially between the first terminal 302 and the second terminal 304, and exposes at least a portion of the first terminal 302 and the second terminal 304. Additionally, the second patterning process is well-known to those skilled in the art, therefore the details such as the lithography methods and etching methods are all omitted herein in the interest of brevity.

Please refer to FIG. 2 again. After forming the semiconductor structure 204 and the first contact hole 306, a second conductive layer (not shown) is formed on the substrate 100 and followed by performing a third patterning process. The third patterning process patterns the second conductive layer in the pixel region 102 and removes the second conductive layer from the test region 104. Consequently, a source/drain 206 is formed on the semiconductor structure 204 in the pixel region 102 and thus a TFT 200 is obtained. After forming the source/drain 206 of the TFT 200, a second insulating layer 108 is formed on the substrate 100 and followed by performing a fourth patterning process. The fourth patterning process patterns the second insulating layer 108 in the pixel region 102 and removes the second insulating layer 108 from the test region 104. Consequently, a second contact hole 208 is formed in the second insulating layer 108 in the pixel region 102.

Please refer to FIG. 3. A transparent conductive layer (not shown) is then formed on the substrate 100 and followed by performing a fifth patterning process. The fifth patterning process patterns the transparent conductive layer to form a pixel electrode 210 electrically connected to the source/drain 206 in the pixel region 102 through the second contact hole 208. The transparent conductive layer in the test region 104 is simultaneously patterned to form a connecting electrode 308 of the testing device in the first contact hole 306. Thus, a testing device 300 is obtained. It is noteworthy that the testing device 300 provided by the present invention is obtained by the conventional TFT process employing the five patterning processes as mentioned above without adding any further processes.

Next, a close/open circuit test is performed to the first terminal 302, the connecting electrode 308 and the second terminal 304 of the testing device 300. In detail, the close/open circuit test is performed to electrically connect the first terminal 302 and the second terminal 304 of the testing device 300, and a test signal is inputted at the first terminal 302. When the test signal passes the first terminal 302 and the connecting electrode 308, and thus the test signal is detected at the second terminal 304 of the testing device 300, a close circuit is recognized to be constructed by the first terminal 302, the connecting electrode 308 and the second terminal 304. It is noteworthy when the second patterning process is accurately aligned, the first contact hole 306 consequently exposes both a portion of the first terminal 302 and a portion of the second terminal 304 of the testing device 300. Therefore, the connecting electrode 308 successfully electrically connects the first terminal 302 and the second terminal 304, and to construct the abovementioned close circuit. According to the close circuit result, alignment accuracy of the second patterning process for forming the first contact hole 306 of the testing device 300 is confirmed. Simultaneously, alignment accuracy of the semiconductor structure 204 of the TFT 200 that is formed simultaneously with the first contact hole 306 in the second patterning process is also confirmed.

Please refer to FIG. 4A and FIG. 4B. On the contrary, when the test signal is not detected at the second terminal 304 of the testing device 300, an open circuit is recognized to be constructed by the first terminal 302, the connecting electrode 308 and the second terminal 304 of the testing device 300.

The open circuit indicates the lithography method of the second patterning process is not accurately aligned. Accordingly, the first contact hole 306 and the semiconductor structure 204 that are simultaneously formed in the second patterning process are not accurately aligned and the overlay is shifted. When the overlay shift excesses the tolerance, the first terminal 302 or the second terminal 304 of the testing device 300 is not exposed in the first contact hole 306 as shown in FIG. 4A or FIG. 4B. Therefore the connecting electrode 308 cannot electrically connect the first terminal 302 to the second terminal 304, and consequently the open circuit as mentioned above is constructed. According to the open circuit result, alignment inaccuracy of the second patterning process for forming the first contact hole 306 of the testing device 300 is confirmed. Simultaneously, alignment inaccuracy of the semiconductor structure 204 of the TFT 200 that is formed simultaneously with the first contact hole 306 in the second patterning process is also confirmed.

Figure 5:
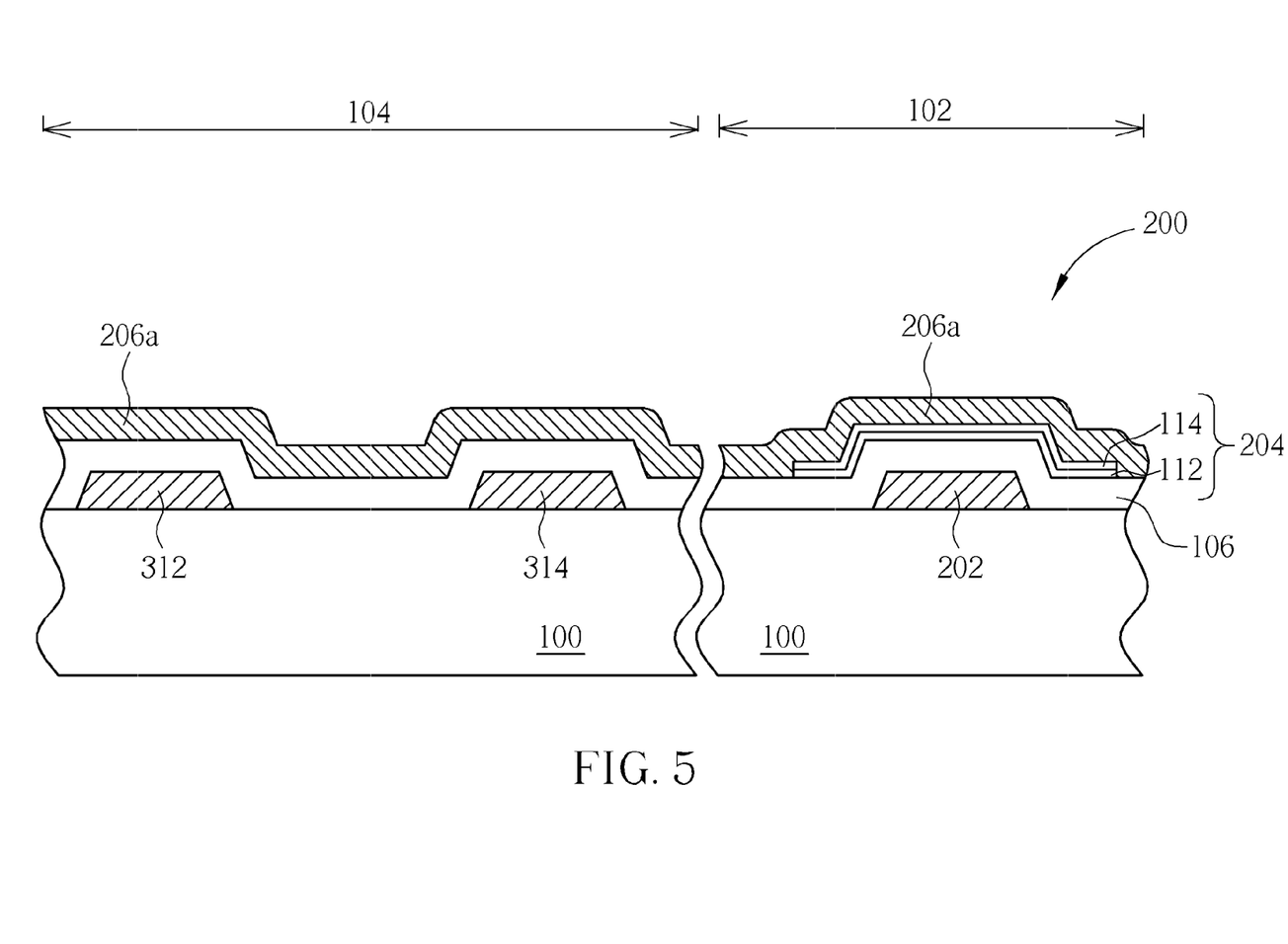
Figure 6:
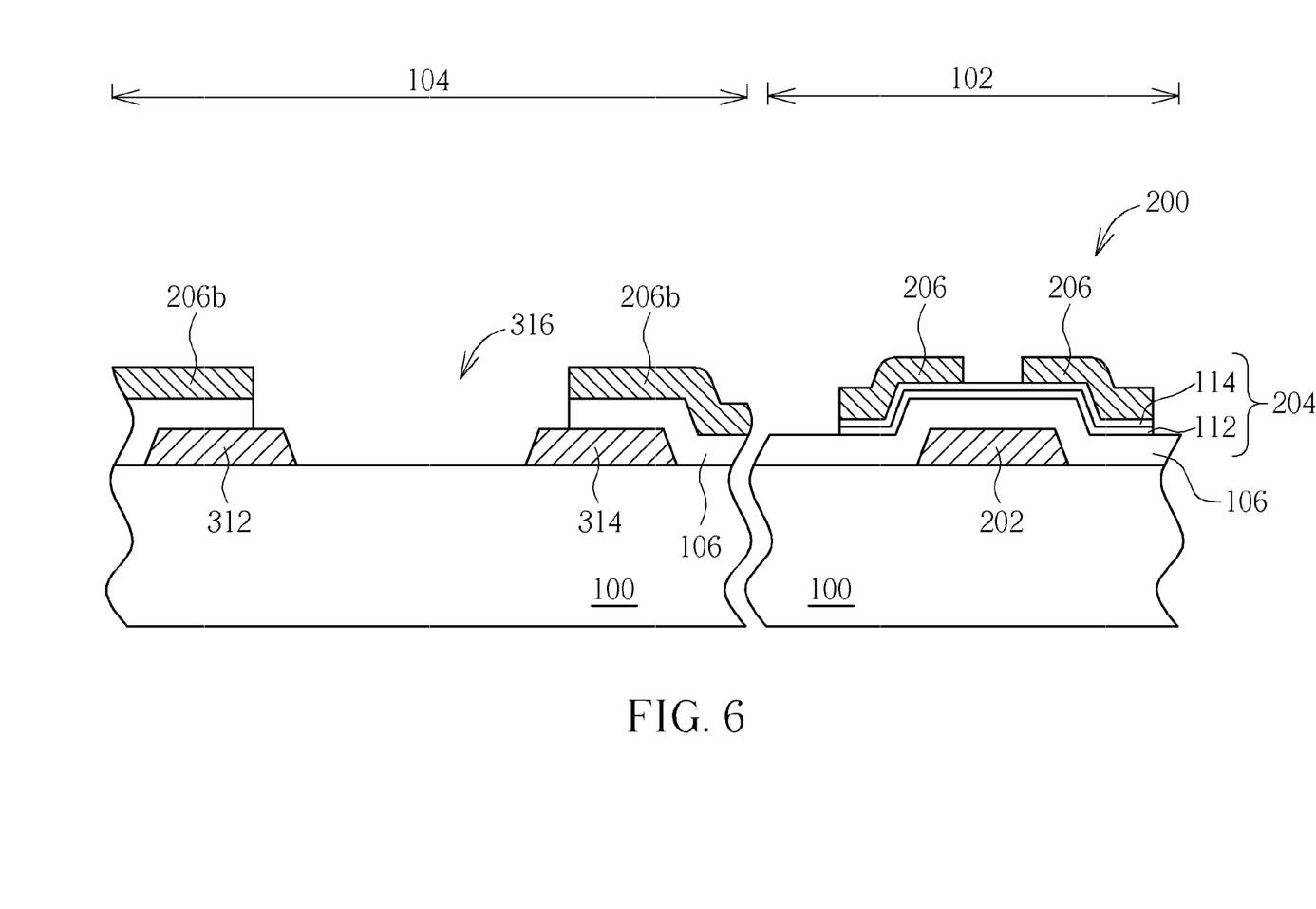
Figure 7:
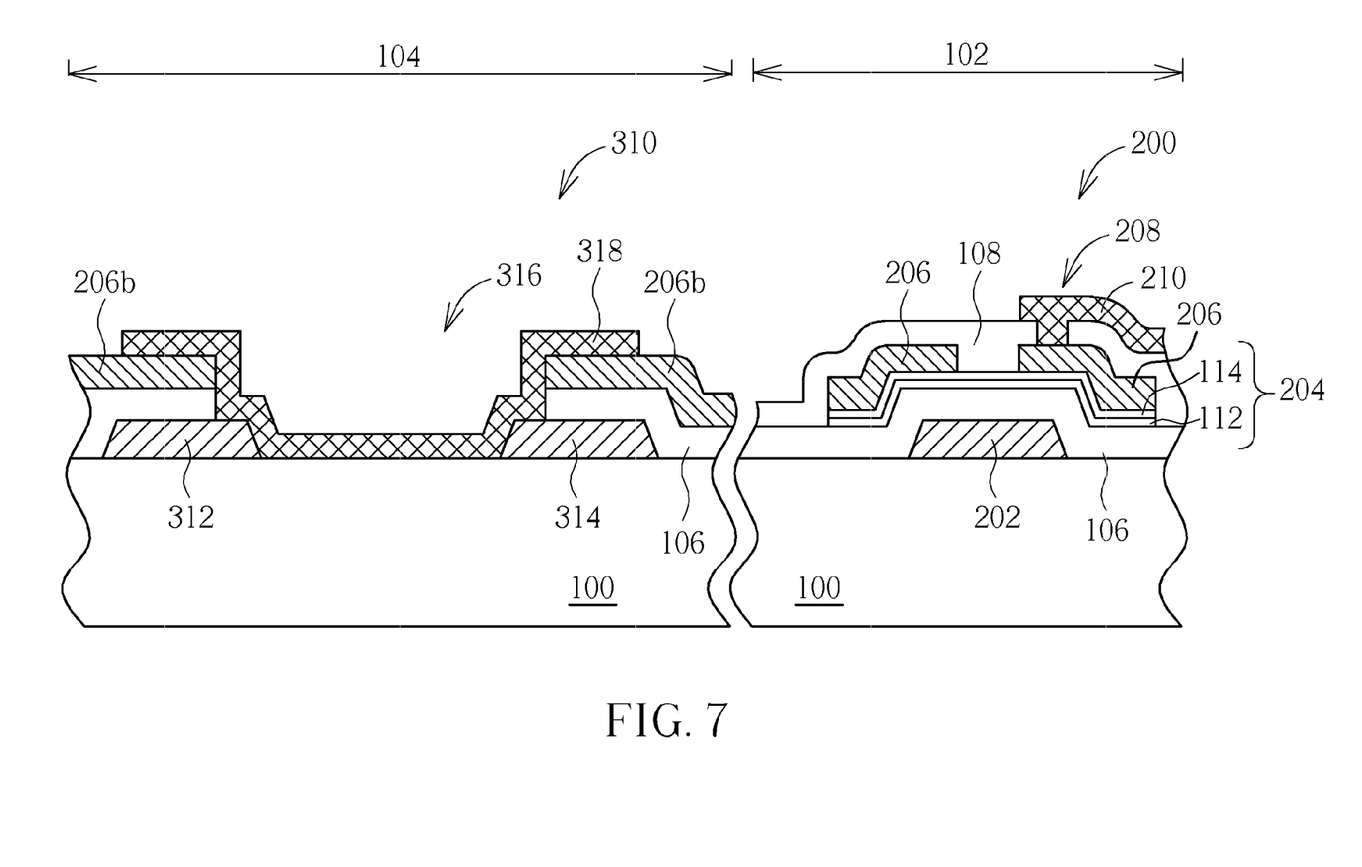
Figure 8:
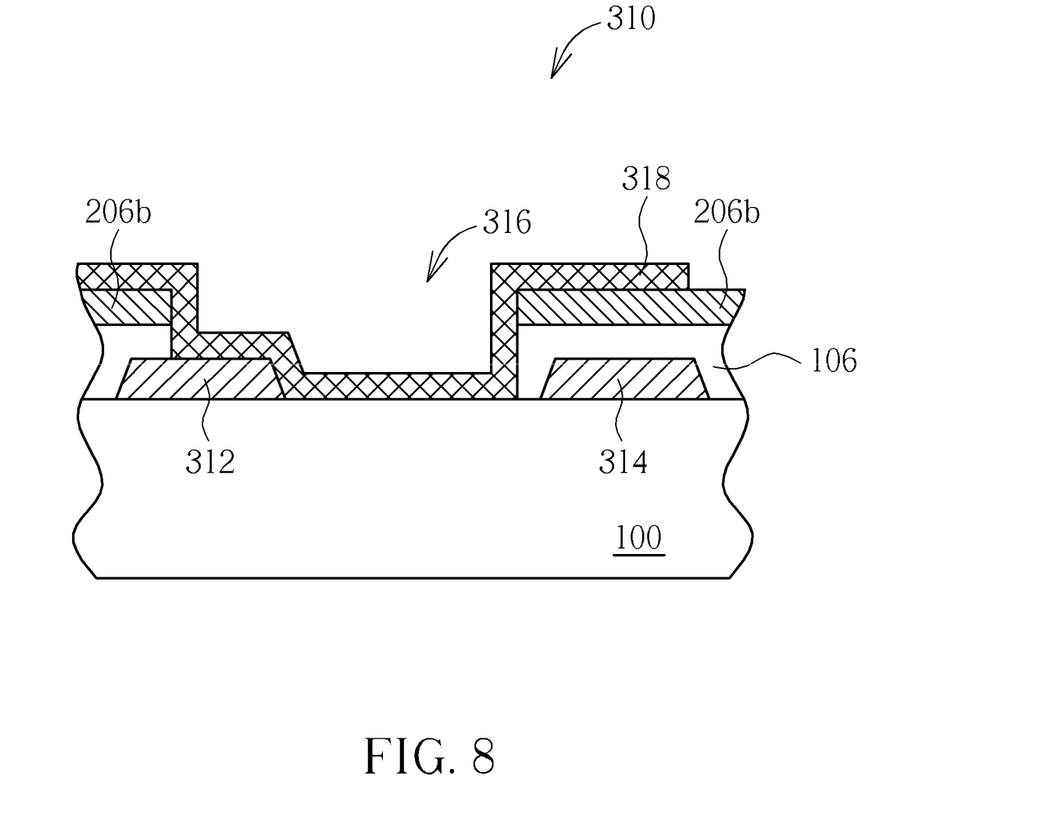
FIG. 8 is a schematic drawing illustrating a portion of the testing device provided by the preferred embodiment.

Please refer to FIGS. 5-8, which are drawings illustrating a method for checking alignment accuracy of a TFT provided by a second preferred embodiment of the present invention, wherein FIG. 8 is a schematic drawing illustrating a portion of the testing device provided by the preferred embodiment. It is noticeable the elements the same in both of the first preferred embodiment and the second preferred embodiment are designated with the same numerals. As shown in FIG. 5, the second preferred embodiment provides the substrate 100 having the pixel region 102 and the test region 104. Then, films formation method and the first patterning process as mentioned in the first preferred embodiment are performed to form the gate electrode 202 of the TFT 200 in the pixel region 102 and a first terminal 312 and a second terminal 314 of a testing device in the test region 104, simultaneously. As mentioned above, the first terminal 312 is electrically isolated from the second terminal 314.

Then, the first insulating layer 106 covering the gate electrode 202 of the TFT 200 and the first terminal 312 and the second terminal 314 of the testing device is formed on the substrate 100 as shown in FIG. 5. Next, the semiconductor layering layer (not shown) is formed on the substrate 100. The semiconductor layer upwardly sequentially includes the undoped semiconductor layer 112 and the doped semiconductor layer 114. A second patterning process as mentioned in the first preferred embodiment is subsequently performed to form the semiconductor structure 204 corresponding to the gate electrode 202 on the first insulating layer 106. As shown in FIG. 5, after forming the semiconductor structure 204 in the pixel region 102, a second conductive layer 206a is formed on the substrate 100.

Please refer to FIG. 6. The third patterning process as mentioned in the first preferred embodiment is performed to pattern the second conductive layer 206a, and thus the source/drain 206 of the TFT 200 is formed corresponding to the semiconductor structure 204 in the pixel region 102. Accordingly, the TFT 200 is obtained. It is noteworthy that the third patterning process used to form the source/drain 206 in the pixel region 102 simultaneously patterns the second conductive layer 206a in the test region 104. Accordingly, a patterned second conductive layer 206b is performed and the patterned second conductive layer 206b serves as an etch mask. As shown in FIG. 6, the first insulating layer 106 in the test region 104 is subsequently etched with the patterned second conductive layer 206b serving as the etch mask. Consequently, a first contact hole 316 is formed in the first insulating layer 106 in the test region 104. The first contact hole 316 is formed corresponding to the first terminal 312 and the second terminal 314 of the testing device.

Please refer to FIG. 7. After forming the source/drain 206 and the first contact hole 316, the second insulating layer 108 is formed on the substrate 100 and followed by performing the fourth patterning process. Accordingly, the second insulating layer 108 is patterned to form the second contact hole 208 in the pixel region 102, and the second insulating layer 108 in the test region 104 is removed. Thereafter, the transparent conductive layer (not shown) is formed on the substrate 100 and followed by performing the fifth patterning process as mentioned in the first preferred embodiment. Accordingly, the transparent conductive layer is patterned to form the pixel electrode 210 in the pixel region 102, and the pixel electrode 210 is electrically connected to the source/drain 206 through the second contact hole 208. Simultaneously, the transparent conductive layer in the test region 104 is patterned to form a connecting electrode 318 of the testing device in the first contact hole 316. Consequently, the testing device 310 is obtained. As mentioned above, the testing device 310 provided by the present invention is obtained by the conventional TFT process employing the five patterning processes without adding any further processes.

Next, a close/open circuit test is performed to the first terminal 312, the connecting electrode 318 and the second terminal 314 of the testing device 310. In detail, the close/open circuit test is performed to electrically connect the first terminal 312 and the second terminal 314 of the testing device 310, and a test signal is inputted at the first terminal 312. When the test signal passes the first terminal 312 and the connecting electrode 318, and thus the test signal is detected at the second terminal 314 of the testing device 310, a close circuit is recognized to be constructed by the first terminal 312, the connecting electrode 318 and the second terminal 314. It is noteworthy when the third patterning process is accurately aligned, the first contact hole 316 consequently exposes both a portion of the first terminal 312 and a portion of the second terminal 314 of the testing device 310. Therefore, the connecting electrode 318 is electrically connected to the first terminal 312 and the second terminal 314 successfully, and to construct the abovementioned close circuit. According to the close circuit result, alignment accuracy of the third patterning process for forming the first contact hole 316 of the testing device 310 is confirmed. Simultaneously, alignment accuracy of the source/drain 206 of the TFT 200 that is formed simultaneously with the first contact hole 316 in the third patterning process is also confirmed.

Please refer to FIG. 8. On the contrary, when the test signal is not detected at the second terminal 314 of the testing device 310, an open circuit is recognized to be constructed by the first terminal 312, the connecting electrode 318 and the second terminal 314 of the testing device 310. The open circuit indicates the lithography method of the third patterning process is not accurately aligned. Accordingly, the first contact hole 316 and the source/drain 206 that are simultaneously formed are not accurately aligned and the overlay is shifted. When the overlay shift excesses the tolerance, the first terminal 312 or the second terminal 314 of the testing device 310 is not exposed in the first contact hole 316 as shown in FIG. 8. Therefore the connecting electrode 318 cannot electrically connect the first terminal 312 to the second terminal 314, and consequently the open circuit as mentioned above is constructed. According to the open circuit result, alignment inaccuracy of the third patterning process for forming the first contact hole 316 of the testing device 310 is confirmed. Simultaneously, alignment inaccuracy of the source/drain 206 of the TFT 200 that is formed simultaneously with the first contact hole 316 in the third patterning process is also confirmed.

Figure 9:
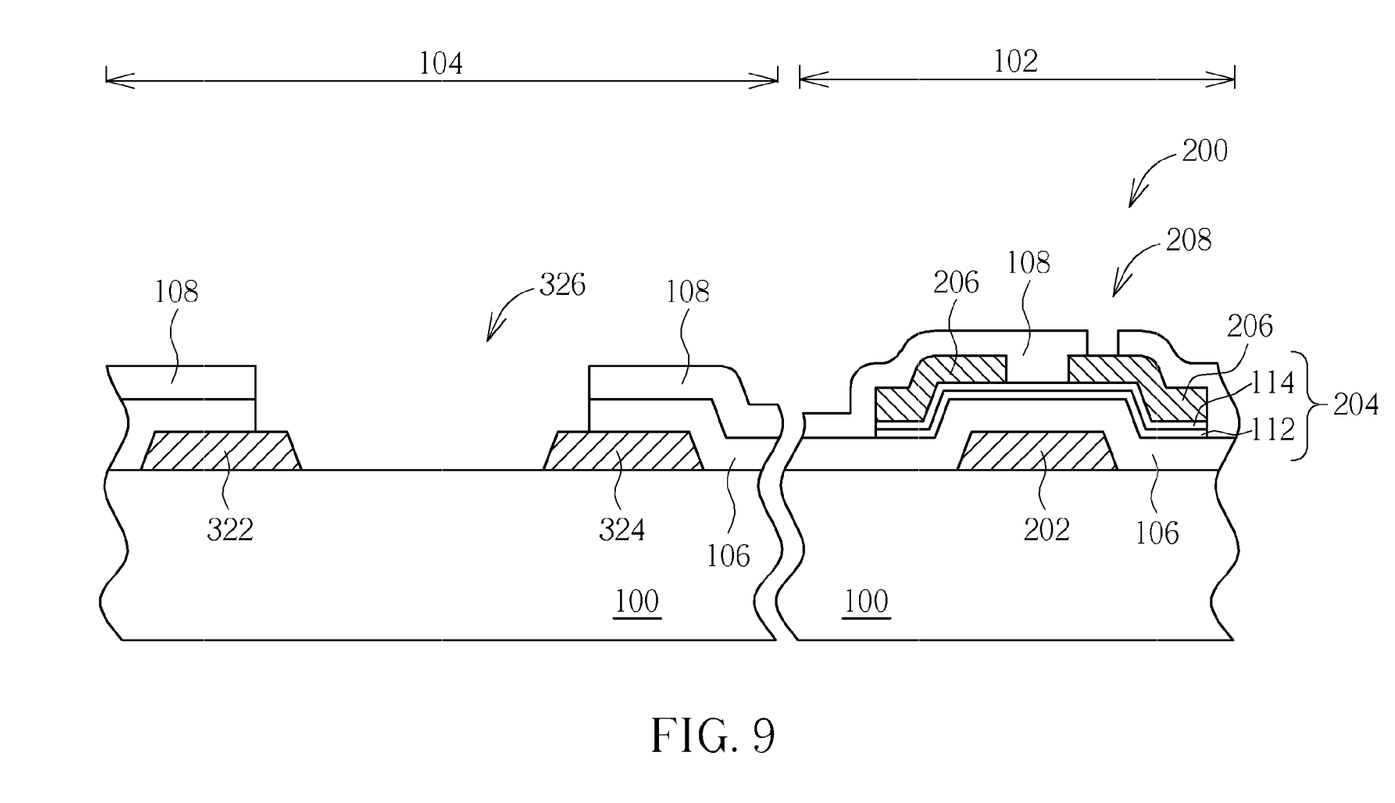
Figure 10:
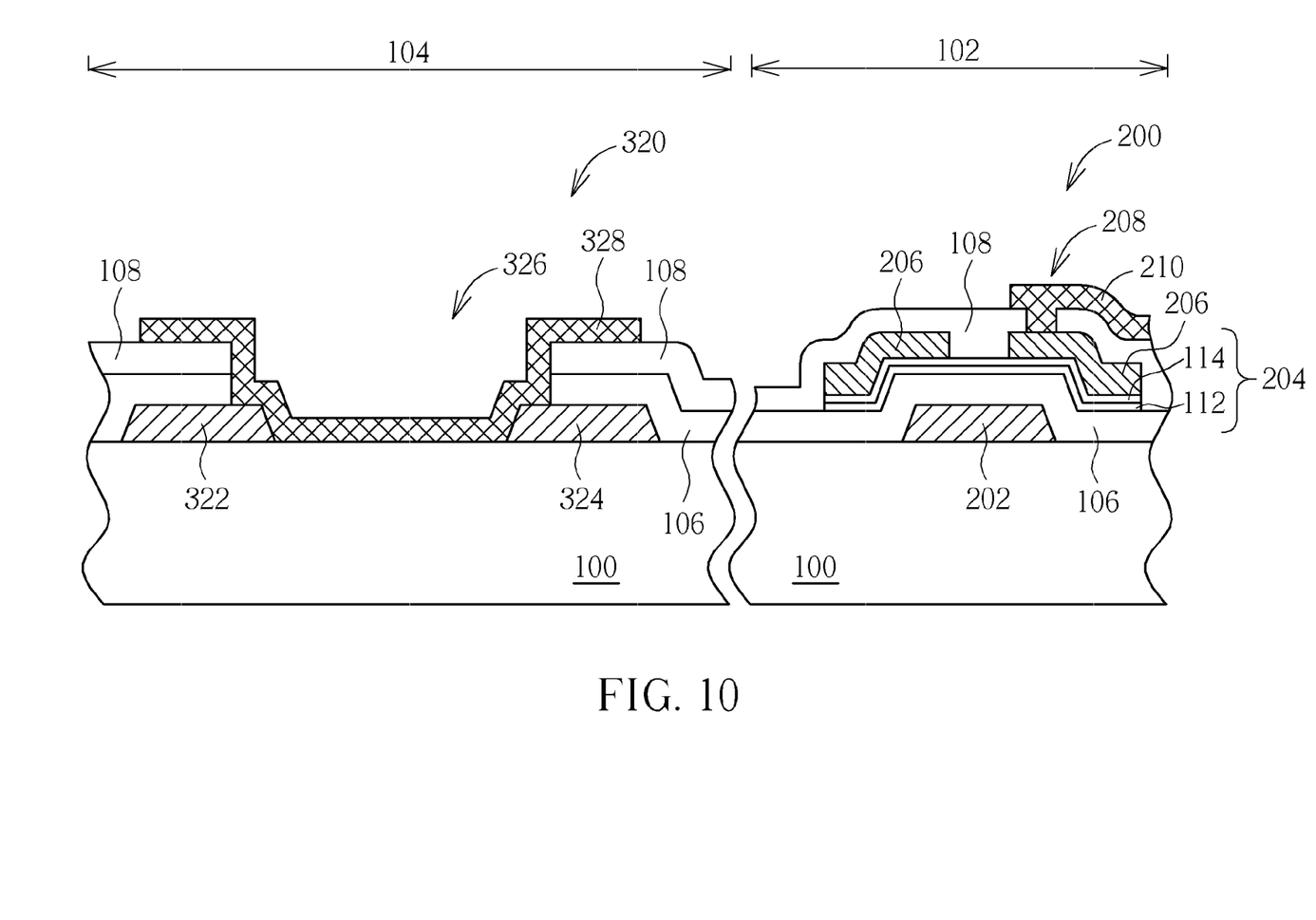
Figure 11:
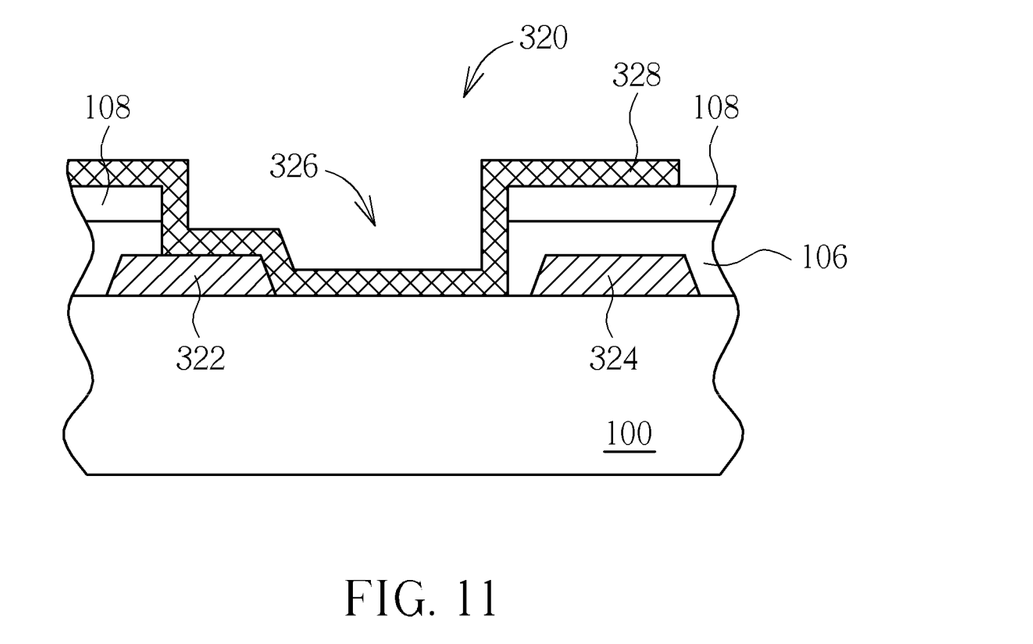
FIG. 11 is a schematic drawing illustrating a portion of the testing device provided by the preferred embodiment.

Please refer to FIGS. 9-11, which are drawings illustrating a method for checking alignment accuracy of a TFT provided by a third preferred embodiment of the present invention, wherein FIG. 11 is a schematic drawing illustrating a portion of the testing device provided by the preferred embodiment. It is noticeable elements the same in both of the aforementioned preferred embodiments and the third preferred embodiment are designated with the same numerals. As shown in FIG. 9, the substrate 100 having the pixel region 102 and the test region 104 defined thereon is first provided. Then, film formation method and the first patterning process as mentioned in the first preferred embodiment are performed to form the gate electrode 202 of the TFT 200 in the pixel region 102 and a first terminal 322 and a second terminal 324 of a testing device in the test region 104 simultaneously. The first terminal 322 is electrically isolated from the second terminal 324.

Next, the first insulating layer 106 covering the gate electrode 202 of the TFT 200 and the first terminal 322 and the second terminal 324 of the testing device is formed on the substrate 100. Then the semiconductor layer (not shown) is formed on the substrate 100. The semiconductor layer upwardly sequentially includes the undoped semiconductor layer 112 and the doped semiconductor layer 114. The second patterning process as mentioned in the first preferred embodiment is subsequently performed to form the semiconductor structure 204 corresponding to the gate electrode 202 on the first insulating layer 106. After forming the semiconductor structure 204, the second conductive layer (not shown) is formed on the substrate 100.

Please refer to FIG. 9 again. Next, the third patterning process as mentioned in the first preferred embodiment is performed to form the source/drain 206 of the TFT 200 corresponding to the semiconductor structure 204 in the pixel region 102. Consequently, the TFT 200 is obtained. Subsequently, the second insulating layer 108 is formed on the substrate 100 and followed by performing the fourth patterning process as mentioned in the first preferred embodiment. The fourth patterning process patterns the second insulating layer 108 to form the second contact hole 208 in the second insulating layer 108 in the pixel region 102. Simultaneously, the fourth patterning process patterns the second insulating layer 108 and the first insulating layer 106 in the test region 104. Thus, a first contact hole 326 is formed in the first insulating layer 106 and the second insulating layer 108 in the test region 104. The first contact hole 326 is formed corresponding to the first terminal 322 and the second terminal 324 of the testing device.

Please refer to FIG. 10. Subsequently, the transparent conductive layer (not shown) is formed on the substrate 100 and followed by performing the fifth patterning process as mentioned in the first preferred embodiment. The fifth patterning process patterns the transparent conductive layer to form the pixel electrode 210 in the pixel region 102. The pixel electrode 210 is electrically connected to the source/drain 206 through the second contact hole 208. Simultaneously, the fifth patterning process patterns the transparent conductive layer in the test region 104 to form a connecting electrode 328 of the testing device in the first contact hole 326. Accordingly, the testing device 320 is obtained.

Next, a close/open circuit test is performed to the first terminal 322, the connecting electrode 328 and the second terminal 324 of the testing device 320. In detail, the close/open circuit test is performed to electrically connect the first terminal 322 and the second terminal 324 of the testing device 320, and a test signal is inputted at the first terminal 322. When the test signal passes the first terminal 322 and the connecting electrode 328, and thus the test signal is detected at the second terminal 324 of the testing device 320, a close circuit is recognized to be constructed by the first terminal 322, the connecting electrode 328 and the second terminal 324. It is noteworthy when the fourth patterning process is accurately aligned, the first contact hole 326 consequently exposes both a portion of the first terminal 322 and a portion of the second terminal 324 of the testing device 320. Therefore, the connecting electrode 328 is electrically connected to the first terminal 322 and the second terminal 324 successfully, and to construct the abovementioned close circuit. According to the close circuit result, alignment accuracy of the fourth patterning process for forming the first contact hole 326 of the testing device 320 is confirmed. Simultaneously, alignment accuracy of the second contact hole 208 of the TFT 200 that is formed simultaneously with the first contact hole 326 in the fourth patterning process is also confirmed.

Please refer to FIG. 11. On the contrary, when the test signal is not detected at the second terminal 324 of the testing device 320, an open circuit is recognized to be constructed by the first terminal 322, the connecting electrode 328 and the second terminal 324 of the testing device 320. The open circuit indicates the lithography method of the fourth patterning process is not accurately aligned. Accordingly, the first contact hole 326 and the second contact hole 208 that are simultaneously formed are not accurately aligned and the overlay is shifted. When the overlay shift excesses the tolerance, the first terminal 322 or the second terminal 324 of the testing device 320 is not exposed in the first contact hole 326 as shown in FIG. 11. Therefore the connecting electrode 328 is not electrically connected to the first terminal 322 and the second terminal 324, and consequently the open circuit as mentioned above is constructed. According to the open circuit result, alignment inaccuracy of the fourth patterning process for forming the first contact hole 326 of the testing device 320 is confirmed. Simultaneously, alignment inaccuracy of the second contact hole 208 of the TFT 200 that is formed simultaneously with the first contact hole 326 in the fourth patterning process is also confirmed.

According to the first to third preferred embodiment, the testing device 300/310/320 provided by the present invention is formed in the test region 104 by the methods that are used to form the TFT: By simultaneously forming the gate electrode 202 of the TFT 200 and the first terminal 302/312/322 and the second terminal 304/314/324, and by simultaneously forming the pixel electrode 210 and the connecting electrode 308/318/328, the testing device 300/310/320 is constructed with the first terminal 302/312/322 serving as an input terminal for a test signal, the second terminal 304/314/324 serving as an output terminal for the test signal, and the connecting electrode 308/318/328 serving as electrical connection between the first terminal 302/312/322 and the second terminal 304/314/324. According to the present invention, the alignment accuracy or inaccuracy is confirmed by recognizing the close circuit or open circuit constructed by the testing device 300/310/320.

Figure 12:
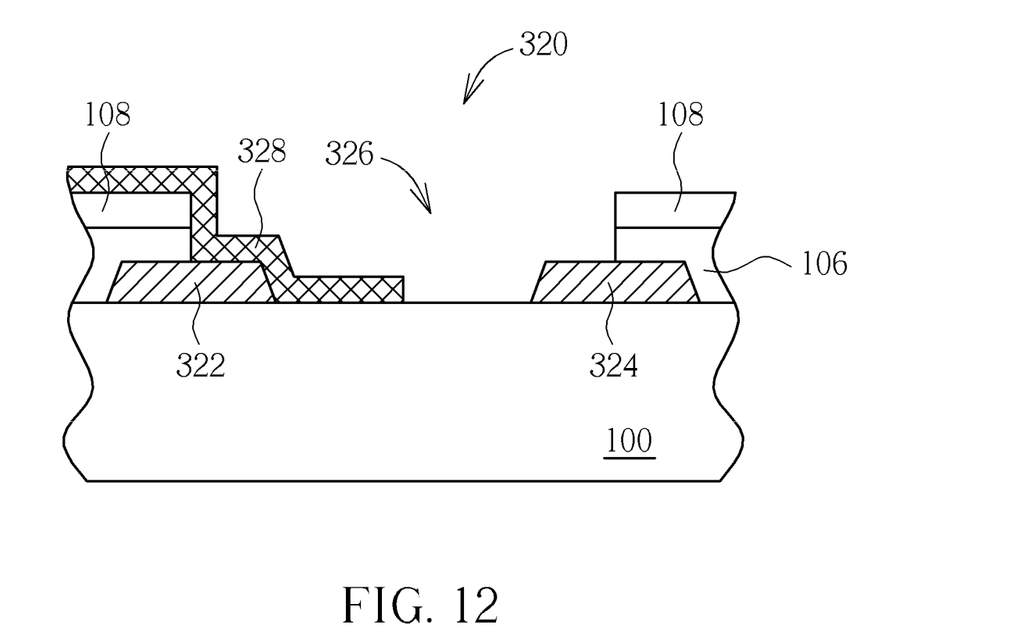
FIG. 12 is a schematic drawing illustrating the testing device provided by the present invention.

Please refer to FIG. 12, which is a schematic drawing illustrating the testing device provided by the present invention. It is well known to those skilled in the art that the overlay shift occurs not only when forming the abovementioned layers, but also occurs when forming the pixel electrode 210 and the connecting electrode 308/318/328 in the fifth patterning process as shown in FIG. 12. When the lithography method of the fifth patterning process is not accurately aligned, the connecting electrode 328 is consequently not accurately aligned and the overlay is shifted. When the overlay shift excesses the tolerance, the connecting electrode 328 is not electrically connected to the first terminal 322 and the second terminal 324, and consequently the open circuit as mentioned above is constructed.

It is noteworthy that when the overlay shift occurs to the connecting electrode 308/318/328 itself, judgment for the close/open circuit cannot be made, or misjudgment is made. As a countermeasure against to the problems, the method for checking alignment accuracy of a TFT provided by the present invention further provides the testing device 300, 310 and 320 respectively in the test region 104 simultaneously with forming the TFTs. When only the testing device 300 constructs the open circuit among the three testing devices 300/310/320, it indicates the second patterning process for forming the first contact hole 306 and the semiconductor structure 204 is not accurately aligned. When only the testing device 310 constructs the open circuit among the three testing devices 300/310/320, it indicates the third patterning process for forming the first contact hole 316 and the source/drain 206 is not accurately aligned. When only the testing device 320 constructs the open circuit among the three testing devices 300/310/320, it assumes the fourth patterning process for forming the second contact hole 208 and the first contact hole 326 is not accurately aligned. More important, when the testing device 300, the testing device 310 and the testing device 320 all construct the open circuit, it assumes the fifth patterning process for forming the connecting electrode 308/318/328 and the pixel electrode 210 is not accurately aligned. Furthermore, other methods for checking the alignment accuracy are not limited to be used or integrated in the present invention.

Figure 13A:
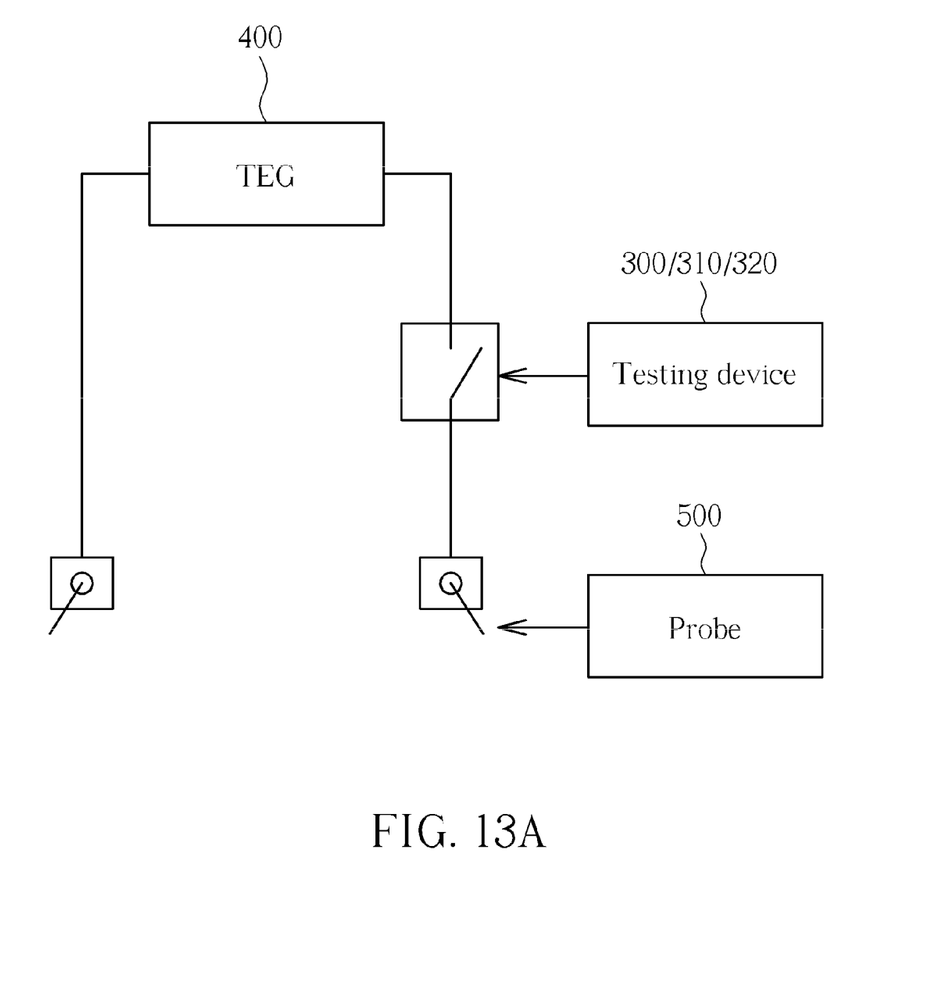
FIG. 13A is a schematic drawing illustrating a method for checking alignment accuracy of a TFT provided by another preferred embodiment provided by the present invention.

Please refer to FIG. 13A, which is a schematic drawing illustrating a method for checking alignment accuracy of a TFT provided by another preferred embodiment of the present invention. It is more noteworthy that the method for checking alignment accuracy of a TFT provided by the present invention adopts the electrical signal as the test tool, therefore, the testing device provided by the present invention is preferably integrated with a test element group (TEG) 400. As shown in FIG. 13A, the testing device 300/310/320 is electrically connected to the TEG 400 in series connection. Therefore, when the electrical test is performed by probing the TEG 400 with a probe 500 of a test station, it simultaneously completes the alignment inspection as mentioned above. In other words, conventional electrical test is further used to check the alignment accuracy according to the method for checking alignment accuracy of a TFT provided by the present invention: when the testing device 300/310/320 and the TEG 400 construct a close circuit, it indicates the layers for forming the TFT are accurately aligned and the electrical test provided by the TEG 400 is still performed; when the testing device 300/310/320 and the TEG 400 construct an open circuit, engineers are requested to determine whether the electrical test fails or the layers of the TFT is not accurately aligned. More important, since the alignment inspection is simultaneously completed with the electrical test, which is an essential inspection procedure, the testing device 300/310/320 integrated with the TEG 400 substantially increases the sampling rates to 25% without increasing any measurement time.

Figure 13B:
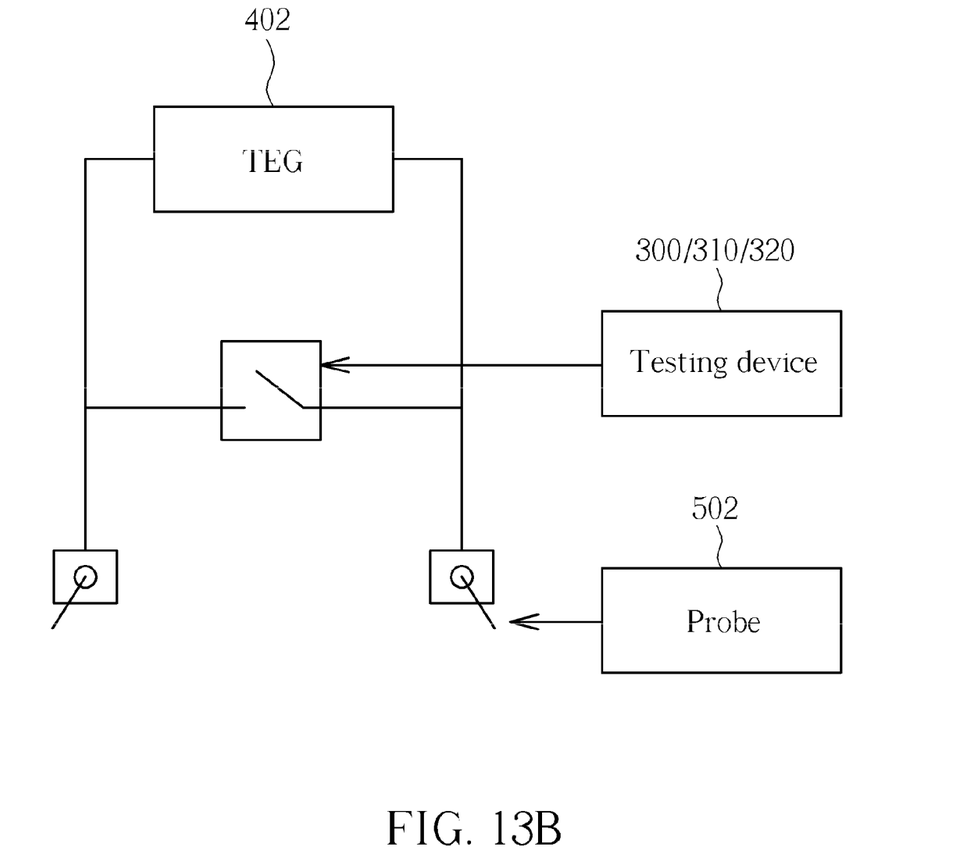
FIG. 13B is a schematic drawing illustrating a method for checking alignment accuracy of a TFT provided by another preferred embodiment provided by the present invention.

Please refer to FIG. 13B, which is a schematic drawing illustrating a method for checking alignment accuracy of a TFT provided by another preferred embodiment of the present invention. As mentioned above, the testing device provided by the present invention is integrated with the TEG 402. As shown in FIG. 13B, the testing device 300/310/320 is electrically connected to the TEG 402 in parallel connection. Therefore, when the electrical test is performed by probing the TEG 402 with a probe 502 of a test station, it simultaneously completes the alignment inspection: when the testing device 300/310/320 construct a short circuit to the TEG 402, it indicates the layers for forming the TFT are accurately aligned; when the testing device 300/310/320 constructs an open circuit while and the TEG 402 constructs a close circuit, it indicates the layers of the TFT is not accurately aligned while the electrical test is still performed. As mentioned above, since the alignment inspection is simultaneously completed with the electrical test, which is an essential inspection procedure, the testing device 300/310/320 integrated with the TEG 402 substantially increases the sampling rates to 25% without increasing any measurement time.

According to the method for checking alignment accuracy of a TFT provided by the present invention, the first contact hole is formed simultaneously with forming the semiconductor structure, the source/drain, the pixel electrode, or the second contact hole for electrically connecting the pixel electrode and the source/drain of the TFT. When the first contact hole is not accurately aligned and formed, the connecting electrode, the first terminal and the second terminal of the testing device cannot be electrically connected to each other, and thus open circuit is obtained. Accordingly, alignment inaccuracy of the patterning process for forming the first contact hole and the certain layer is confirmed. Furthermore, the method for checking alignment accuracy of a TFT provided by the present invention is operated as a close/open circuit test, therefore the test results are easily and speedily obtained. Accordingly, measurement time for checking alignment accuracy of a TFT is substantially reduced and sampling rate is increased.

Those skilled in the art will readily observe that numerous modifications and alterations of the device and method may be made while retaining the teachings of the invention.

What is claimed is:

1. A method for checking alignment accuracy of a thin film transistor (TFT), comprising:
   providing a substrate having a pixel region and a test region defined thereon;
   forming a first conductive layer on the substrate and performing a first patterning process to the first conductive layer to form a gate electrode of a TFT in the pixel region and simultaneously to form a first terminal and a second terminal of a testing device in the test region, the first terminal and the second terminal being electrically isolated;
   forming a first insulating layer covering the gate electrode of the TFT and the first terminal and the second terminal of the testing device on the substrate;
   forming a first contact hole corresponding to the first terminal and the second terminal of the testing device in the first insulating layer;
   forming a pixel electrode in the pixel region and a connecting electrode of the testing device in the first contact hole in the test region; and
   performing a close/open circuit test; wherein
   when the first terminal, the connecting electrode and the second terminal construct a close circuit, alignment accuracy is confirmed and when the first terminal, the connecting electrode and the second terminal construct an open circuit, alignment inaccuracy is confirmed.

2. The method for checking alignment accuracy of a TFT according to claim 1, further comprising:
   forming a semiconductor layer on the substrate; and
   performing a second patterning process to pattern the semiconductor layer to form at least a semiconductor structure corresponding to the gate electrode on the first insulating layer in the pixel region.

3. The method for checking alignment accuracy of a TFT according to claim 2, wherein the second pattern process patterns the first insulating layer under the semiconductor layer in the test region to form the first contact hole in the first insulating layer in the test region simultaneously with forming the semiconductor structure in the pixel region.

4. The method for checking alignment accuracy of a TFT according to claim 2, further comprising:
   forming a second conductive layer on the substrate; and
   performing a third patterning process to pattern the second conductive layer to form a source/drain of the TFT in the pixel region.

5. The method for checking alignment accuracy of a TFT according to claim 4, further comprising:
   forming a second insulating layer on the substrate; and
   performing a fourth patterning process to pattern the second insulating layer to form a second contact hole in the second insulating layer in the pixel region.

6. The method for checking alignment accuracy of a TFT according to claim 5, further comprising:
   forming a transparent conductive layer on the substrate; and
   performing a fifth patterning process to pattern the transparent conductive layer to form the pixel electrode in the pixel region and the connecting electrode of the testing device in the test region.

7. The method for checking alignment accuracy of a TFT according to claim 6, wherein the first contact hole is formed before performing the fifth patterning process.

8. The method for checking alignment accuracy of a TFT according to claim 1, wherein the testing device is electrically connected to a test element group (TEG).

* * * * *